(12) United States Patent
Silfvenius

(10) Patent No.: US 7,599,586 B2
(45) Date of Patent: Oct. 6, 2009

(54) INTEGRATED CHIP

(75) Inventor: Christofer Silfvenius, Stockholm (SE)

(73) Assignee: PhoXtal Communications AB, Kista (SE)

( * ) Notice: Subject to any disclaimer, the term of this patent is extended or adjusted under 35 U.S.C. 154(b) by 121 days.

(21) Appl. No.: 11/921,159

(22) PCT Filed: May 18, 2006

(86) PCT No.: PCT/SE2006/050139

§ 371 (c)(1),
(2), (4) Date: Dec. 10, 2007

(87) PCT Pub. No.: WO2006/130094

PCT Pub. Date: Dec. 7, 2006

(65) Prior Publication Data

US 2009/0041407 A1 Feb. 12, 2009

(30) Foreign Application Priority Data

May 30, 2005 (SE) .................................... 0501217

(51) Int. Cl.
G02B 6/10 (2006.01)
G02B 6/26 (2006.01)
H01S 5/00 (2006.01)

(52) U.S. Cl. ............................. 385/14; 385/37; 385/46; 385/129; 385/130; 385/131; 372/43.01

(58) Field of Classification Search .................... 385/14, 385/28, 37, 46, 129–131; 372/43.01
See application file for complete search history.

(56) References Cited

U.S. PATENT DOCUMENTS

| 5,987,050 | A | 11/1999 | Doerr et al. | |
| 7,072,542 | B2 * | 7/2006 | Jenkins et al. | ................. 385/28 |
| 7,529,436 | B2 * | 5/2009 | Joyner et al. | ................... 385/14 |
| 2002/0064201 | A1 | 5/2002 | Matsumoto | |
| 2004/0105476 | A1 | 6/2004 | Wasserbauer | |

FOREIGN PATENT DOCUMENTS

| EP | 1 458 069 A1 | 9/2004 |
| WO | 2004/034530 A1 | 4/2004 |

* cited by examiner

Primary Examiner—Frank G Font
Assistant Examiner—Michael P Mooney
(74) Attorney, Agent, or Firm—Young & Thompson

(57) ABSTRACT

An integrated chip for data communication, telecommunication and optical analysis for at least one, two or more wavelengths where the chip can be used not only to emit light but also to detect light. The invention is characterised in that the chip (1) includes a waveguide (2) with a first port (3), in that the waveguide (2) expands from the first port (3) in the direction of at least one second waveguide (4) and one third waveguide (6) with at least one second port (5) and one third port (7), respectively, these being placed parallel to each other or at an angle to each other, and separated by a certain distance, and in that the various components of the chip (1) are monolithically integrated.

17 Claims, 4 Drawing Sheets

INTEGRATED CHIP

The present invention relates to an integrated chip for data communication and telecommunication or for analysis applications in which the chip can be used both to emit light from narrow waveband light sources such as lasers or broadband light sources such as, for example, light diodes, and to be able to detect laser light or light from other light sources such as, for example, light from light diodes or luminescent light from biological specimens or similar.

With respect to data communication and telecommunication, lasers and light diodes are used to emit light and photodetectors are used to detect light that has been sent along light conductors. Laser chips are normally used to emit laser light that is modulated with the information that is to be sent, while photodetectors in the form of chips are used to detect the laser light received. Each such functionality normally comprises different components.

Composite chips are also available with several functions, such as transmitting and receiving laser light of a number of wavelengths. It is necessary when using existing solutions to use expensive high-accuracy alignment of several discrete components, such as separate laser diodes, light diodes, photodiodes, wavelength-selecting prisms, waveguides, etc., on one common substrate of, for example, silicon, in order in this way to achieve a chip with several functions.

Such chips that are known are therefore expensive, and complex to manufacture.

The present invention solves this problem and offers a chip that can be used for several functions, while being simpler and cheaper to manufacture than known chips.

The present invention thus relates to an integrated chip for data communication, telecommunication and optical analysis for at least one, two or more wavelengths where the chip can be used not only to emit light but also to be able to detect light, and it is characterised in that the chip comprises a waveguide with a first port, in that the waveguide expands from the first port in a direction towards at least one second waveguide with a second port and one third waveguide with a third port, these being located either parallel or at an angle to each other and at a certain separation from each other, and in that the various components of the chip mentioned above are monolithically integrated.

Figure 1:
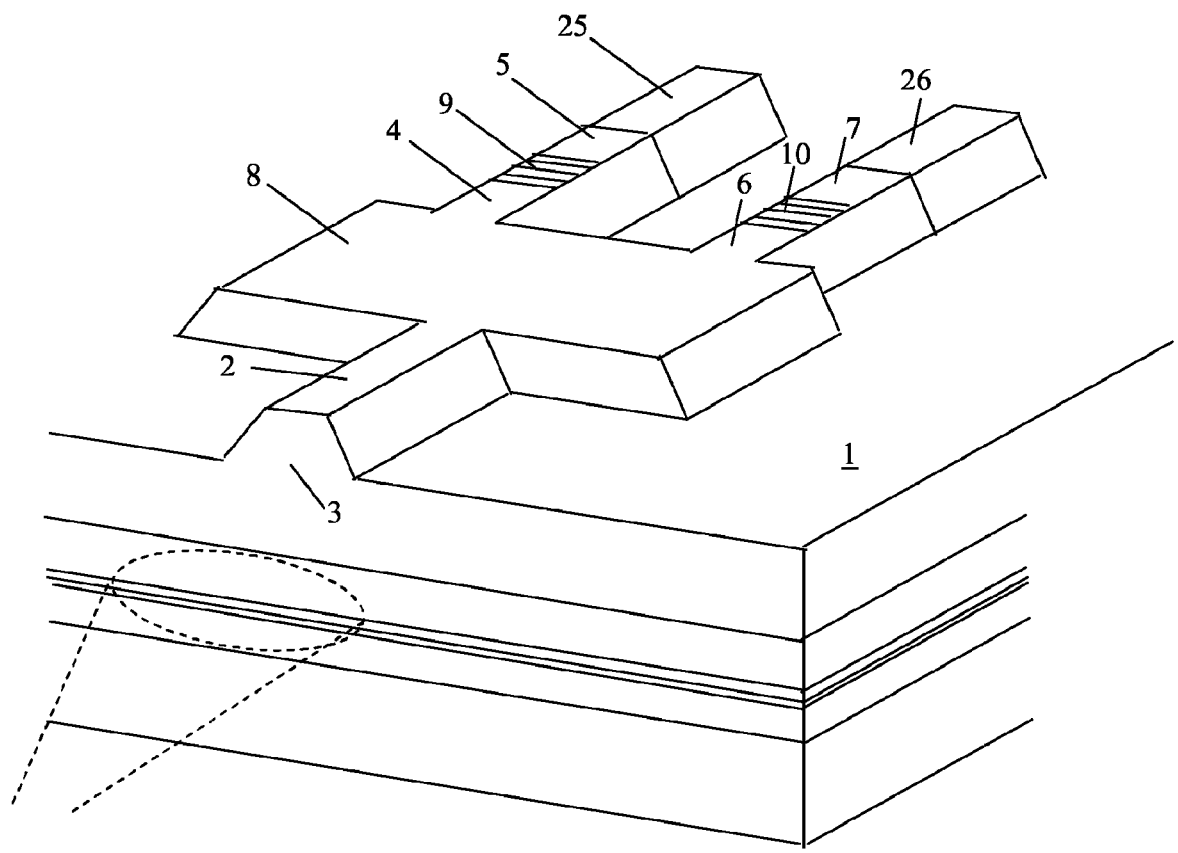
Figure 2:
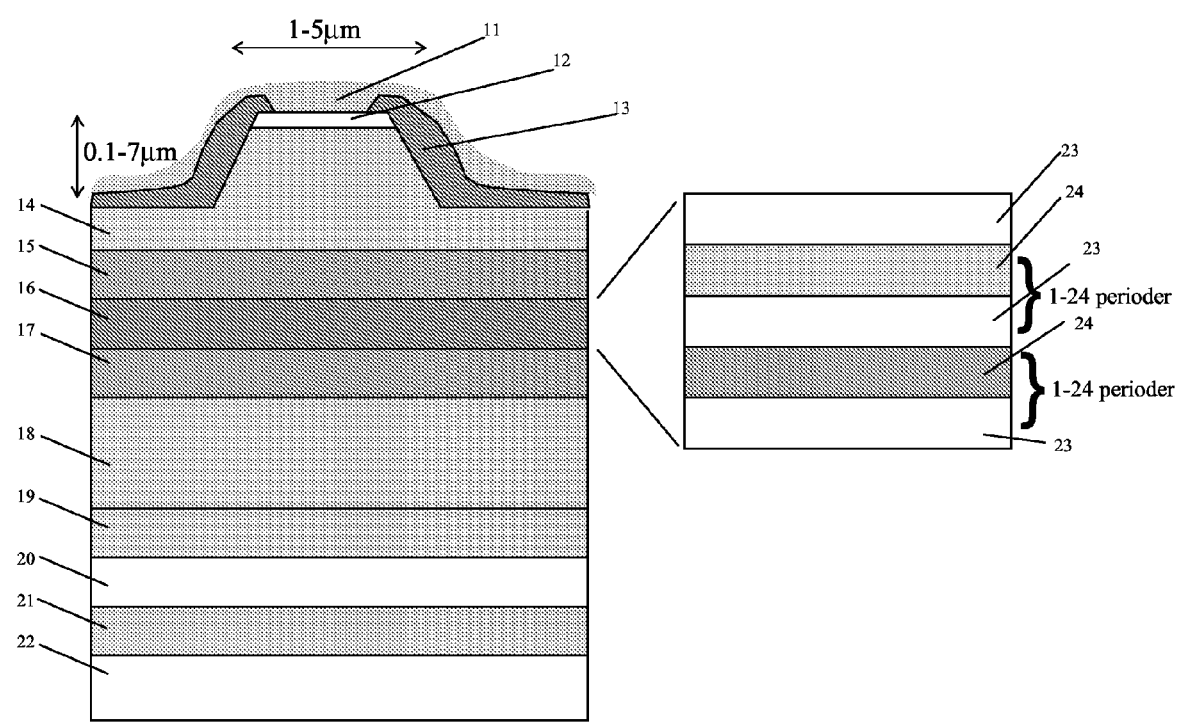
Figure 3:
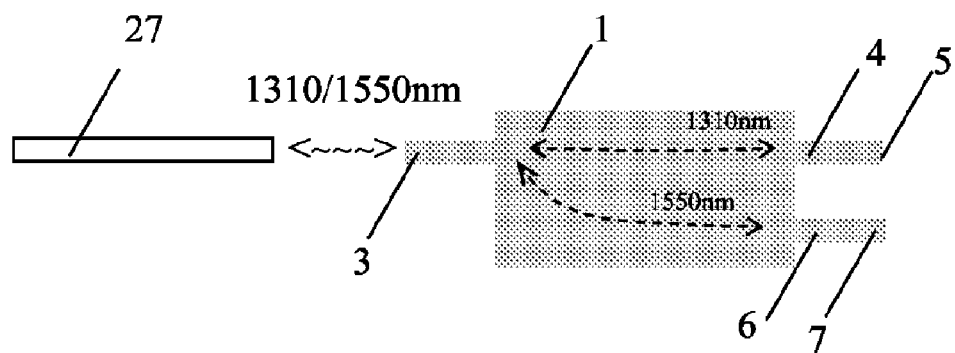
Figure 4:
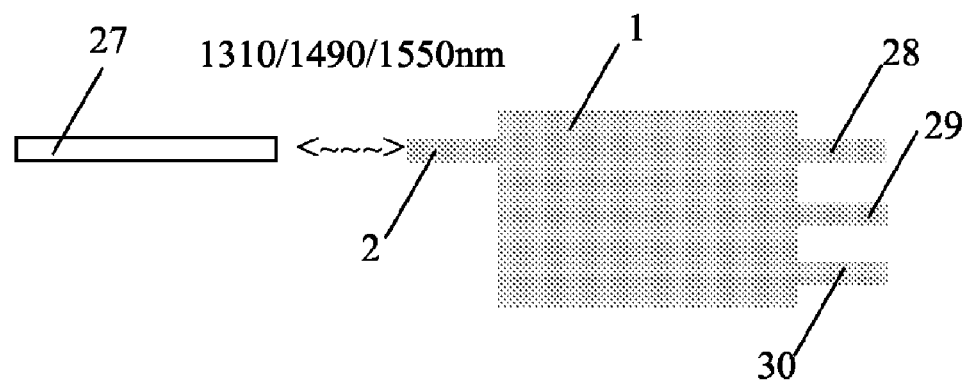
Figure 5:
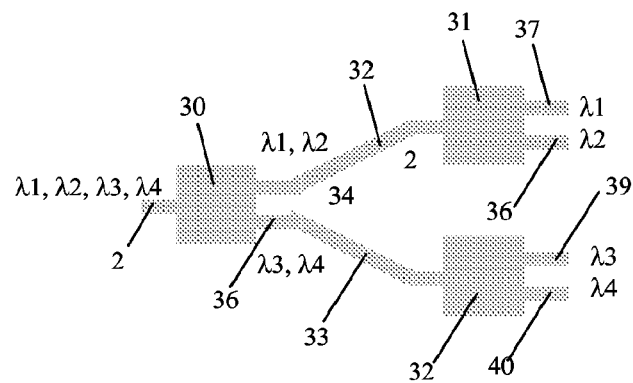
Figure 6:
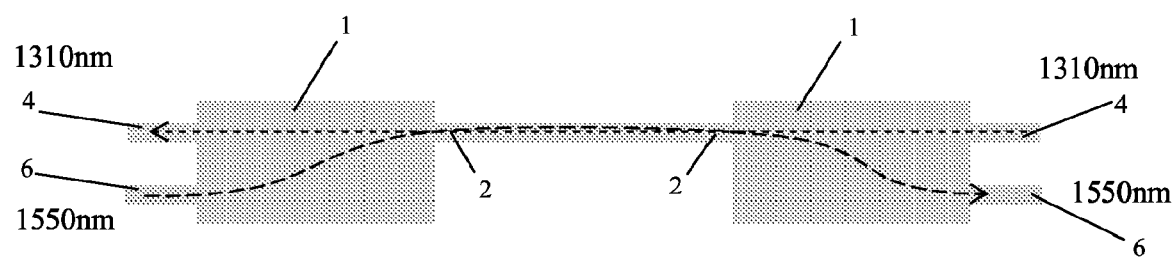

The invention will be described in more detail blow, partially with reference to an embodiment of the invention shown in the attached drawings, where FIG. 1 shows a sketch of a monolithically integrated chip according to the invention, FIG. 2 shows a cross-section through a basic structure according to the invention, FIG. 3 illustrates schematically one function in an optical system in which the invention is applied, FIG. 4 illustrates schematically a second function in an optical system in which the invention is applied, FIG. 5 shows an alternative connection scheme, FIG. 6 shows two coupled components according to the invention.

The invention thus relates to a monolithically integrated chip in which several functions such as transmission and reception of a number of wavelengths have been integrated into one unit.

As a fundamental principle in order to achieve a method for monolithic integration directly in the material from which the subcomponents have been manufactured, something of the performance of the each included component must be sacrificed, such as, for example, increased internal losses or limitations in the speed of modulation due to the common basic structure being adapted to all components included. It is probable that the basic structure will not be optimised for the function of any individual subcomponent.

The losses, etc., that arise, however, do not fully remove functionality: they only limit it somewhat such that the performance that remains is sufficient to meet the technical requirements within a range of applications.

The present invention thus concerns an integrated chip for data communication, telecommunication and optical analysis for at least one, two or more wavelengths where the chip can be used not only to emit light but also to be able to detect light across a broad spectrum, such as 1480-1600 nm for data communication and telecommunication, or another spectral range for optical analysis.

FIG. 1 shows schematically a monolithically integrated chip according to the invention, before metallisation, with input waveguides, multimode interferometer (MMI) couplings, and distributed feedback (DFB) lasers at the outputs.

According to the invention, the chip 1 comprises a waveguide 2 with a first port 3 into which or out from which it is intended that light should be led. The waveguide 2 expands from the first port 3 in a direction towards a second waveguide 4 with a second port 5 and a third waveguide 6 with a third port 7, which ports 5, 7 are positioned parallel or at an angle to each other and at a certain distance apart. The ports 5, 7 are arranged to lead light in and out. According to the invention, the different components of the chip 1 are monolithically integrated.

According to the invention, the expanded part of the waveguide (2) after the coupler can lead out into more than two ports.

According to a preferred embodiment of the invention, each one of the second 4 and the third 6 waveguides constitutes together with its respective grating 9, 10, an RWG-DFB laser, which lasers are tuned to different wavelengths or to the same wavelength.

In order to detect incident light, it is preferred that photodetectors 25, 26, such as photodiodes, are arranged instead of lasers or light diodes, or photodetectors located after the DFB lasers as monitors of the status of the lasers or the light diodes during the lifetime of the component.

According to a second preferred embodiment, light diodes are arranged at the first waveguide (2), and at the second waveguide (4) and/or the third waveguide (6).

According to a preferred embodiment of the invention the expanded part 8 of the waveguide comprises a wavelength-selective coupler in order to achieve simultaneous bi-directional functionality. In this way, the wavelength-selective coupler of a type such as MMI, evanescent, array waveguide coupler, etc., be used, and this gives in principle no loss of power since all light of a certain wavelength is directed to that port at which it is to be detected, and vice versa for transmission.

It is, however, preferred that a multimode interferometer (MMI) is used, since it is stable in production and can be made such that it does not depend on polarisation. It can, furthermore, handle several wavelengths and the number of ports can be varied. It is possible, furthermore, to manufacture MMIs at low cost. Also an evanescent coupler, with or without a separation of the input waveguides, has similar advantages to those of an MMI coupler, and it is, furthermore, totally lacking in internal reflections from the ports. The evanescent coupler may consist of two or more waveguides.

An MMI waveguide 8 allows the incident fundamental mode to expand to a combination of several higher order modes together with the fundamental mode. The interference pattern that arises depends on the thicknesses and the refractive indices of the basic structure and the other materials that have arisen during the process, together with the physical dimensions of the MMI waveguide. It is possible to design a 1×2 MMI in such a manner that the two incident wavelengths at a certain distance from the input port (corresponding to the length of the MMI) have superpositions of maxima at different locations (relative to the width of the MMI) where the respective output ports have been placed. The MMI and the other couplers may have a symmetric function, i.e. if the output ports may function as optical inputs, the light from the two input ports will make its way to the single output port. The MMI and the evanescent coupler may, furthermore, be designed in a manner that does not depend on polarisation, something that is of major importance. They can, furthermore, be designed compactly, which is important for low-cost applications and in order to reduce the optical absorption.

According to an alternative embodiment, the expanded part 8 of the waveguide comprises what is known as a "star coupler". A star coupler expands the optical mode that is input from the fibre such that two ports can be placed next to each other. Variants of a DFB filter or of another filter are placed at the parallel ports such that only one wavelength can pass through each port. This is a compact solution, but a large part of the input optical power is lost in losses.

In the case in which the expanded part 8 of the waveguide comprises a star coupler, a wavelength-selective filter, not shown, is formed at the second port 5 and the third port 7 respectively.

FIG. 2 shows a basic structure according to the invention. The basic structure in the example shown in FIG. 2 has been processed to give an RWG laser.

Epitaxial layers are manufactured on a substrate of InP (or GaAs) using MOCVD or MBE.

The basic structure comprises, from the top downwards, a Ti/Pt/Au p-contact 11, a p-InGaAs contact layer 12, a SiNx or SiO$_x$ layer 13, a p-InP cladding layer 14, a layer of p-SCH: InGaAsP or AlInGaAs 15, a layer 16 of quantum wells 24 surrounded by barrier layers or with both replaced by a bulk layer 23. The layer 16 is shown at the right of FIG. 2 at a higher scale, in which it is made clear that the layer 16 comprises 1 to 24 alternating layers of quantum wells and barrier layers in order to produce a wavelength, for example 1310 nm, or, alternatively, 1 to 24 alternating layers of quantum wells and barrier layers, or both types of layer, replaced by a bulk layer for the production or detection of a second wavelength, for example 1550 nm in the band 1480-1600 nm. In order to obtain a photodetector that is independent of polarisation, it is a major advantage that a bulk layer is used that has equal sensitivity for TE and TM modes of the incident signal. A photodetector that is independent of polarisation may alternatively be obtained with the aid of stress optimisation of the quantum well package or of the bulk layers, such that the TE and TM modes are absorbed to an equal degree in the photodetector. The basic structure comprises, furthermore, a layer of n-SCH:InGaAsp or AlInGaAs 17, followed by a buffer layer 18 of n-InP, with a thickness of, for example, 0.5 μm, and an n-cladding layer, with a thickness of, for example 1 μm. There is located under this an n-InP substrate 19, an n-contact 20 of, for example, 500 Å Ti—W, followed by Au with a thickness of, for example, 1000-4000 Å. There is furthermore a solder layer 21 and a substrate 22 of, for example, CuW, AlN or similar. The thickness of the layers 15 and 17 can be 1.1 μm, the thickness of the layer 19 80-120 μm. The width of the waveguides 2, 5, 7 can be 5-15 μm.

The SiNx/SiOx layer can be omitted and the depth of etching can differ between p-cladding to n-cladding and it can be regrown or filled with PCB™ or similar polymers. The same process is used for an MMI, but the waveguide can have a width of up to 100 μm.

A basic structure according to the invention can be manufactured by conventional methods such as metal organic chemical vapour deposition (MOCVD), or molecular beam epitaxy (MBE), and the number of subsequent process steps can be kept at a very low number if sufficient functionality can be obtained of the subcomponents with a common depth of etching. It is, of course, possible to use several depths of etching, and this may improve the performance of the system, but it increases the cost of the manufacture somewhat and this may be an obstacle, if extremely low manufacturing costs are of interest, at a level of, for example, CD-ROM lasers. A greater depth of etching may, however, be necessary for optical and electrical insulation between the subcomponents that are part of the system.

The said basic structure is covered by resist and a pattern can be defined by E-beam, lithography or interference pattern, in order to be subsequently dry-etched or wet-etched to give a waveguide structure.

The etch can be terminated in the p-contact layer, the p-cladding, the active waveguide, or the n-cladding.

The structure can then subsequently undergo, where relevant, a regrowth procedure with resistive InP, GaAs, InGaAs, InGaAsP, InAlGaAs, or it may be covered by PCB or a similar polymer partially up to or over the edge of the waveguides or, following a further cover of resist in which contact surfaces (pads) have been defined, be covered with approximately 500 Å Ti, 500 Å Pt and 1000-4000 Å Au by vapour deposition or sputter-coating, and thereafter be subject to metal lift-off processing.

The structure may, where relevant, be subsequently covered with silicon nitrides, silicon oxides or other dielectric material, and whereafter the silicon nitride, etc., is progressively opened, so that the subsequent metallisation comes into direct contact with the semiconductor in selected areas, while being blocked from contact in other areas.

The structure can then be thinned from the reverse side and polished to a total thickness of 80-120 μm before the reverse side is metallised by sputter-coating (vapour deposition) with 500 Å Ti—W alloy and 1000-4000 Å Au. The reverse side may also, where relevant, be given a coating with a eutectic alloy of Au—Sn of thickness 4000-8000 Å by means of vapour deposition or sputtering.

There are three alternatives, in principle, for the construction of the chip.

A first alternative is based on a shallow waveguide, known as a "ridge wave guide" (RWG), which gives a weak coupling of the light to the waveguide. The advantage is that the method is used for mass production of, for example, 980 nm pumped lasers and that the sensitive active layer is not etched through. Good results have, furthermore, been achieved with a variant of RWG lasers that do not have a SiN$_x$ or SiO$_x$ dielectric between the contact metal and the semiconductor, and where the current can, in principle, pass from metal to semiconductor in the areas that have been etched away, that is, at the side of the waveguide. In practice, however, the current flows only in a highly doped p-contact layer at the top of the waveguide, i.e. in that part that has not been etched away.

It is, furthermore, probable that the stress that is often present in the SiN$_x$ or SiO$_x$ material will with time pull the semiconductor material apart and degrade the components. Very stable components have been presented without the intermediate dielectric. A major advantage in achieving low manufacturing costs is that it is not necessary to use sensitive processing stages in which openings are to be made in the SiN$_x$ or SiO$_x$ materials in order to make it possible to contact the semiconductor at the correct location. Alternatively, only one significantly less sensitive stage remains, namely that of defining contact pads with a precision of +/−2-10 µm in a lithography stage. This is to be compared with a required precision of +/−1-2 µm if contact openings must be made.

In addition, the number of steps is reduced in which resist is present on the surface that is subsequently to be covered with Ti—Pt—Au or similar, where residues related to resist often give increased contact resistance or even makes the yield drastically lower since they are difficult to detect during the manufacture, being transparent and as little as approximately 10-50 Å thick.

A second alternative is a standard RWG process according to a 980 nanometer type of pumped laser with SiNx/SiOx or PCB or another polymer as dielectric. This alternative is more expensive than the said first alternative, but it gives a somewhat higher performance.

A third alternative is to etch more deeply through the active waveguide and to regrow the components with resistive InP by means of MOCVD or HVPE. This alternative gives higher performance of the components but it is at the same time the most expensive manufacturing alternative. It does, however, give the highest performance.

The present integrated chip can be manufactured according to all of the above alternatives.

Etching can be carried out as dry etching or wet etching, while the mask definition can take place using lithography or electron beam pattern generation. DFB and distributed Bragg gratings (DBGs) can be defined using electron bean pattern generation or by optical interference. The most direct method of manufacture is to use electron beam pattern generation in order to define all waveguide types, all DFBs and all DBG gratings at the same time, and combining this with a dry etching process that produces the waveguides, the DFBs and/or the DBGs by etching in the same process step.

The use of suitable wet etching methods cannot, however, be excluded.

The MMI and the evanescent coupler are flexible from the point of view of design, and they can be manufactured in a number of variants, with different numbers of ports and wavelength sensitivity. It is possible to postulate, for example, the commercially interesting case in which our case is supplemented with one port that receives signals at 1490 nm and that a photodiode is placed at that port, in such a manner can what is known as "triplexes" be built. These normally are located in domiciles and receive data at 1550 nm, transmit data at 1310 nm (the data being digitally coded in both cases), also receiving cable-TV signals at 1490 nm, coded in an analogue manner. The chip can be in the same way be manufactured for the other side of the link, which transmits at 1550 and 1490 nm, and receives information at 1310 nm.

The combination of facet-free lasers with cavities fully defined by gratings and light that is led directly onwards to variations of MMI waveguides, directly aligned with each other during the manufacture, opens the opportunity for also other applications. One such other application, for example, has a 1×N MMI with N outputs connected to N lasers with different lasing wavelengths $\lambda_N$, according to, for example, the ITU channels, and this is probably more stable with respect to wavelength drift than alternative solutions. Furthermore, all wavelengths are always available, and in this manner the time required for change of wavelength in tuneable applications is, in principle, zero. Alternatively, N channels can be used simultaneously, or N/2 channels can be used simultaneously with N/2 channels then acting as back-up alternatives. Furthermore, it should be possible to cascade-couple the MMI and the evanescent couplers, if there are advantages with separating the management of wavelengths or the management of waveguides in units that can be designed or manufactured for more specific requirements that a large MMI or another coupler.

FIG. 3 shows an example of the use of the present chip 1. A single-mode fibre 27 leads light of two wavelengths, 1310 nm (or similar in the band 1260-1360 nm) and 1550 nm (or similar in the band 1480-1600 nm) respectively to and from the first port 3. The light is selected in the MMI 1 such that the wavelength 1310 nm falls on the waveguide 4. while the wavelength 1550 nm falls on the waveguide 6. In a corresponding manner, the wavelength 1310 nm is produced by the laser in the waveguide 4 and light with the wavelength 1550 nm can be produced in the laser in the waveguide 6. The most common use should be transmission at one wavelength and reception at one wavelength.

FIG. 4 shows in principle the same as in FIG. 3, but the MMI 1 in FIG. 4 has been constructed with three parallel waveguides 28, 29, 30, constructed as lasers or photodetectors. Incident light in the single-mode fibre 27 can have, for example, two different wavelengths, for example 1490 and 1550 nm. The three different wavelengths are selected by means of the MMI, each to one of the three waveguides 28, 29 and 30, transmission of which takes place at 1310 nm (or, transmission at 1490 and 1550 nm, with reception at 1310 nm).

FIG. 5 illustrates a coupling in which incident light, in a single-mode fibre 2, with four different wavelengths is divided in a first MMI 30 without a grating in the waveguides 34, 36 such that two of the wavelengths are selected to a first waveguide 34 and the remaining two wavelengths are selected to a second waveguide 36. A waveguide 32 leads the light to a second MMI 31 and a waveguide 33 leads the light to a third MMI 32. The light is divided in the respective MMI 31 and 32 such that light of only one wavelength is selected to each of the waveguides 37-40. The waveguides 37-40 can comprise lasers for the relevant wavelength. Since the couplings are recursive, each port can be configured as a transmitter or a receiver.

FIG. 6 shows two coupled components according to the invention. This can be achieved through the use of two components 1 that have been manufactured as one unit before cleavage for control measurement directly on the wafer, which reduces the manufacturing cost.

A number of embodiments have been described above. It is obvious that these can be modified by one skilled in the arts in order to be adapted for a particular use.

One application is the biological analysis of samples, where optical illumination takes place using a light source with a broad spectrum (a light diode, 1100-2000 nm) or one or several partial spectra with narrow wavebands (lasers), where luminescent light from the sample is led via a wavelength-selective coupler to unique photodetectors. It is also possible to conceive that other types of coupler can be used, such as multichannel wavelength-selectors, such that the wavelength selection increases to several ports. The reception region for photodetection and light emission via light diode or laser (1100-2000 nm) can be increased with the aid of sub-band absorption for the photodiode and by the use of cascade coupling in the active region of the light diode and lasers (>2000 nm).

Thus the present invention is not to be regarded as limited to the embodiments specified above since it can be varied within the scope of the attached patent claims.

The invention claimed is:

1. An integrated chip for data communication, telecommunication and optical analysis for at least one, two or more wavelengths where the chip can be used not only to emit light but also to detect light, characterised in that the chip (1) comprises a waveguide (2) with a first port (3), in that the waveguide (2) expands from the first port (3) in the direction of at least one second waveguide (4) and one third w waveguide (6) with at least one second port (5) and one third port (7), respectively, these being placed parallel to each other or at an angle to each other, and separated by a certain distance, characterised in that the chip has a basic structure which is equal from a carrier (22) and upwards over the whole of the surface of the chip, in that said wave guide is formed at the upper surface of the chip by means of that the basic structure has been etched down so that upwardly extending wave guides have been formed and in that the various said components of the chip (1) are monolithically integrated.

2. An integrated chip according to claim 1, characterised in that each one of the second waveguide (4) and the third waveguide (6) comprise a grating (9, 10), whereby each waveguide constitutes a laser, and in that the two lasers are tuned to the same or to different wavelengths.

3. An integrated chip according to claim 1, characterised in that light diodes are arranged at the first waveguide (2), at one of the second waveguide (4) and/or the third waveguide (6).

4. An integrated chip according to claim 1, characterised in that photodetectors (25, 26), such as photodiodes placed after the lasers (4, 6) as monitors for the lasers or instead of the lasers, are arranged to detect incident light.

5. An integrated chip according to claim 1, characterised in that an evanescent coupler is formed in the expanded part of the waveguide (2).

6. An integrated chip according to claim 1, characterised in that an MMI is formed in the expanded part of the waveguide (2).

7. An integrated chip according to claim 1, characterised in that what is known as a "star coupler" is formed in the expanded part of the waveguide (2).

8. An integrated chip according to claim 7, characterised in that a wavelength-selective filter (25, 26) is formed at the second port (5) and at the third port (7), respectively.

9. An integrated chip according to claim 1, characterised in that the chip (1) comprises two layers (15, 17) of InGaAsP or AlInGaAs, and in that a stack of quantum wells (24) exists between the said two layers, surrounded by barrier layers (23) or quantum wells and barriers replaced by a bulk layer.

10. An integrated chip according to claim 9, characterised in that the quantum wells or the bulk layer (24) are formed in InGaAsP or AlInGaAs and the barrier layers (23) in InGaAsP or AlInGaAs.

11. An integrated chip according to claim 1, characterised in that the expanded part of the waveguide (2) after the coupler opens out into more than two ports.

12. An integrated chip according to claim 2, characterised in that photodetectors (25, 26), such as photodiodes placed after the lasers (4, 6) as monitors for the lasers or instead of the lasers, are arranged to detect incident light.

13. An integrated chip according to claim 2, characterised in that an evanescent coupler is formed in the expanded part of the waveguide (2).

14. An integrated chip according to claim 2, characterised in that an MMI is formed in the expanded part of the waveguide (2).

15. An integrated chip according to claim 2, characterised in that what is known as a "star coupler" is formed in the expanded part of the waveguide (2).

16. An integrated chip according to claim 2, characterised in that the chip (1) comprises two layers (15, 17) of InGaAsP or AlInGaAs, and in that a stack of quantum wells (24) exists between the said two layers, surrounded by barrier layers (23) or quantum wells and barriers replaced by a bulk layer.

17. An integrated chip according to claim 2, characterised in that the expanded part of the waveguide (2) after the coupler opens out into more than two ports.

* * * * *